United States Patent
Ahn

(10) Patent No.: US 7,741,683 B2
(45) Date of Patent: Jun. 22, 2010

(54) SEMICONDUCTOR DEVICE

(75) Inventor: Jung-Ho Ahn, Denyang-gun (KR)

(73) Assignee: Dongbu HiTek Co., Ltd., Seoul (KR)

( * ) Notice: Subject to any disclaimer, the term of this patent is extended or adjusted under 35 U.S.C. 154(b) by 10 days.

(21) Appl. No.: 12/189,168

(22) Filed: Aug. 10, 2008

(65) Prior Publication Data

US 2009/0057782 A1  Mar. 5, 2009

(30) Foreign Application Priority Data

Aug. 29, 2007  (KR) .................. 10-2007-0087001

(51) Int. Cl.
*H01L 27/088* (2006.01)
*H01L 23/02* (2006.01)

(52) U.S. Cl. ............... 257/401; 257/679; 257/E23.176

(58) Field of Classification Search ............... 257/401, 257/213, 288, 368, 679, E23.176
See application file for complete search history.

(56) References Cited

U.S. PATENT DOCUMENTS

2007/0126100 A1* 6/2007 Mizuno et al. .............. 257/679

* cited by examiner

*Primary Examiner*—Thomas L Dickey
*Assistant Examiner*—Nikolay Yushin
(74) *Attorney, Agent, or Firm*—Sherr & Vaughn, PLLC

(57) ABSTRACT

A semiconductor device is disclosed. Embodiments relate to a semiconductor device which includes an active region including a source region, a drain region, and a channel region. A gate electrode, source electrodes, and a drain electrode are formed around the active region. A plurality of gate fingers diverge from the gate electrode into the channel region. A plurality of source fingers diverge from the source electrodes into the source region, the source fingers being disposed between the gate fingers in a predetermined pattern, the source fingers having at least two finger lines connected to each other via at least one grid line. A plurality of drain fingers diverge from the drain electrode into the drain region, the drain fingers being disposed between the gate fingers where the source fingers are not disposed.

18 Claims, 7 Drawing Sheets

SEMICONDUCTOR DEVICE

The present application claims priority under 35 U.S.C. 119 to Korean Patent Application No. 10-2007-0087001 (filed on Aug. 29, 2007), which is hereby incorporated by reference in its entirety.

BACKGROUND

Various characteristics are measured to evaluate radio frequency (RF) performance of a semiconductor device, e.g., a metal oxide semiconductor field-effect transistor (MOSFET). Important characteristics include maximum oscillation frequency ($f_{MAX}$) and cut-off frequency ($f_T$). The $f_{MAX}$ and $f_T$ are characteristics related to the operational frequency of a device. Specifically, $f_{MAX}$ is a characteristic at which the operational frequency is evaluated in terms of electric power, and the $f_T$ is characteristics at which the operation frequency is evaluated in terms of electric current.

FIG. 1 is a view illustrating a semiconductor device 20 mounted over a substrate 10 having a ground signal ground (GSG) electrode structure. FIG. 2 is a plan view illustrating a finger type electrode structure of the semiconductor device 20. To improve $f_{MAX}$ and $f_T$ in RF applications, as shown in FIGS. 1 and 2, the semiconductor device is manufactured with a finger type structure.

Referring to FIG. 1, six electrodes 11-1 to 11-4, 12-1, and 12-2 are formed over the substrate 10. The four electrodes 11-1 to 11-4, which are formed at four corners of the substrate, respectively, are used as ground electrodes. The two electrodes 12-1 and 12-2, which are located between the corresponding ground electrodes, are used as signal electrodes.

The ground electrodes 11-1 to 11-4 and the signal electrodes 12-1 and 12-2 are connected to each other via conductive patterns 13 and 14. The semiconductor device 20 is mounted over the center of the substrate 10 such that the semiconductor device 20 is electrically connected to the conductive patterns 13 and 14.

Referring to FIG. 2, the semiconductor device 20 is constructed with the bodies of four electrodes 21, 22, and 23 disposed around an active region 24. Finger type electrodes diverge from the bodies of the respective electrodes 21, 22, and 23 into the active region 24. The two source electrodes 21 are formed at opposite sides of the active region 24. Fingers 21-1 of the source electrodes 21 and fingers 22-1 of the drain electrode 22 are alternately disposed between fingers 23-1 to 23-4 of the gate electrode 23.

The two ground electrodes 11-1 and 11-2 located at the upper side of the substrate 10 shown in FIG. 1 are bonded to the upper source electrode 21 of the semiconductor device 20. The two ground electrodes 11-3 and 11-4 located on the lower side of the substrate 10 are bonded to the lower source electrode 21 of the semiconductor device 20. The gate electrode 23 of the semiconductor device 20 is bonded to the left signal terminal 12-1 of the substrate 10. The drain electrode 22 of the semiconductor device 20 is bonded to the right signal terminal 12-2 of the substrate 10.

However, in the structure of each finger electrode of the semiconductor device 20, a single metal line diverges from the corresponding body, limiting improvements in RF performance, i.e., $f_{MAX}$ and $f_T$.

SUMMARY

Embodiments relate to a semiconductor device, and more particularly, to a semiconductor device constructed such that source electrodes and drain electrode are connected to each other in a grid structure, or fingers of the source electrodes and fingers of the drain electrode are connected to each other in a grid structure, thereby improving radio frequency characteristics (RF characteristics). Embodiments relate to a semiconductor device in which RF characteristics, such as $f_{MAX}$ and $f_T$, are improved by optimized electrode structures.

Embodiments relate to a semiconductor device which includes an active region including a source region, a drain region, and a channel region. A gate electrode, source electrodes, and a drain electrode are formed around the active region. A plurality of gate fingers diverge from the gate electrode into the channel region. A plurality of source fingers diverge from the source electrodes into the source region, the source fingers being disposed between the gate fingers in a predetermined pattern, the source fingers having at least two finger lines connected to each other via at least one grid line. A plurality of drain fingers diverge from the drain electrode into the drain region, the drain fingers being disposed between the gate fingers where the source fingers are not disposed.

Embodiments relate to a semiconductor device which includes an active region including a source region, a drain region, and a channel region. A gate electrode, source electrodes, and a drain electrode are formed around the active region. A plurality of gate fingers diverge from the gate electrode into the channel region. A plurality of source fingers diverge from the source electrodes into the source region, the source fingers being disposed between the gate fingers in a predetermined pattern. A plurality of drain fingers diverge from the drain electrode into the drain region, the drain fingers being disposed between the gate fingers where the source fingers are not disposed, the drain fingers having at least two finger lines connected to each other via at least one grid line.

DRAWINGS

Figure 3:
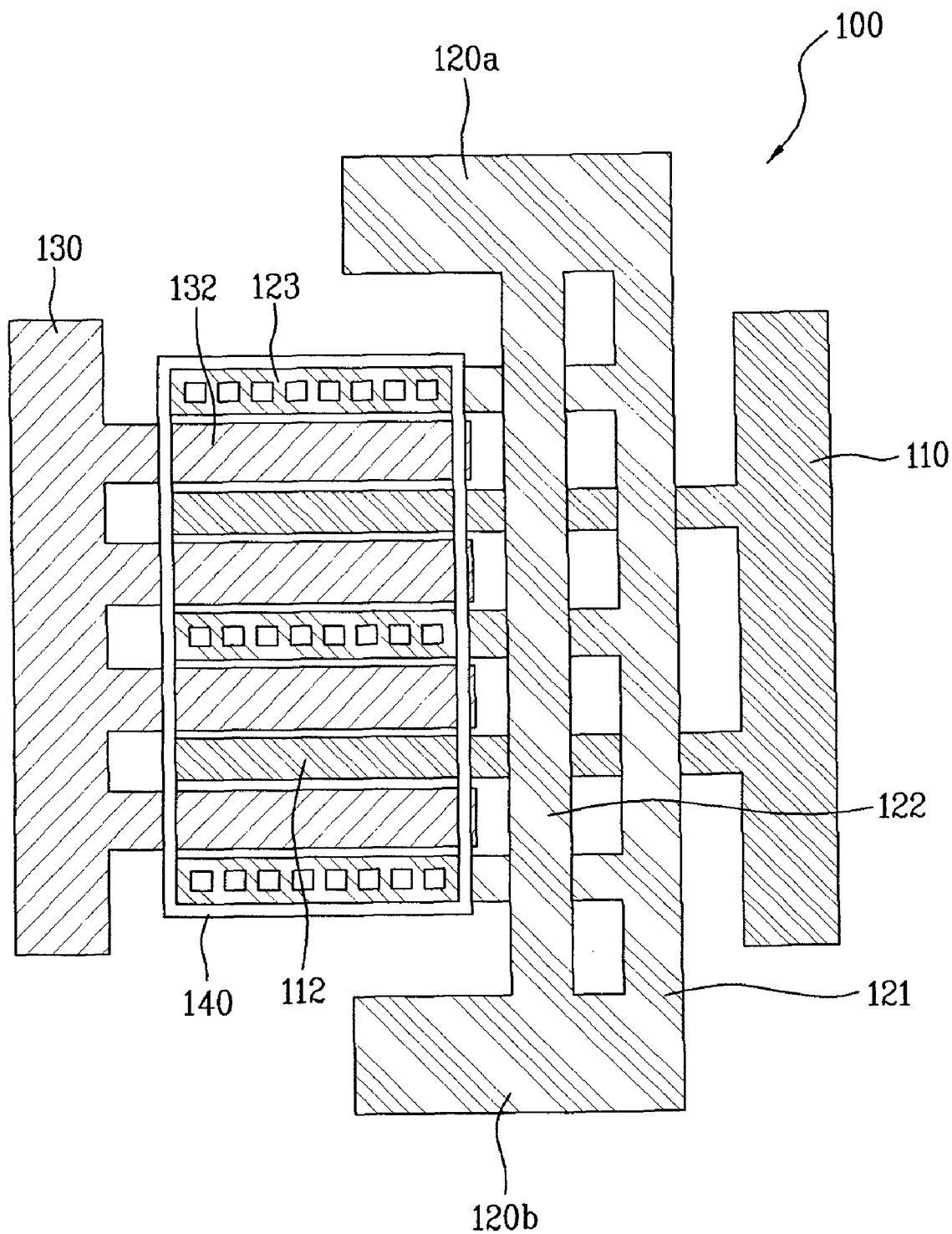

Example FIG. 3 is a plan view illustrating an electrode structure of a semiconductor device according to embodiments.

Figure 4:
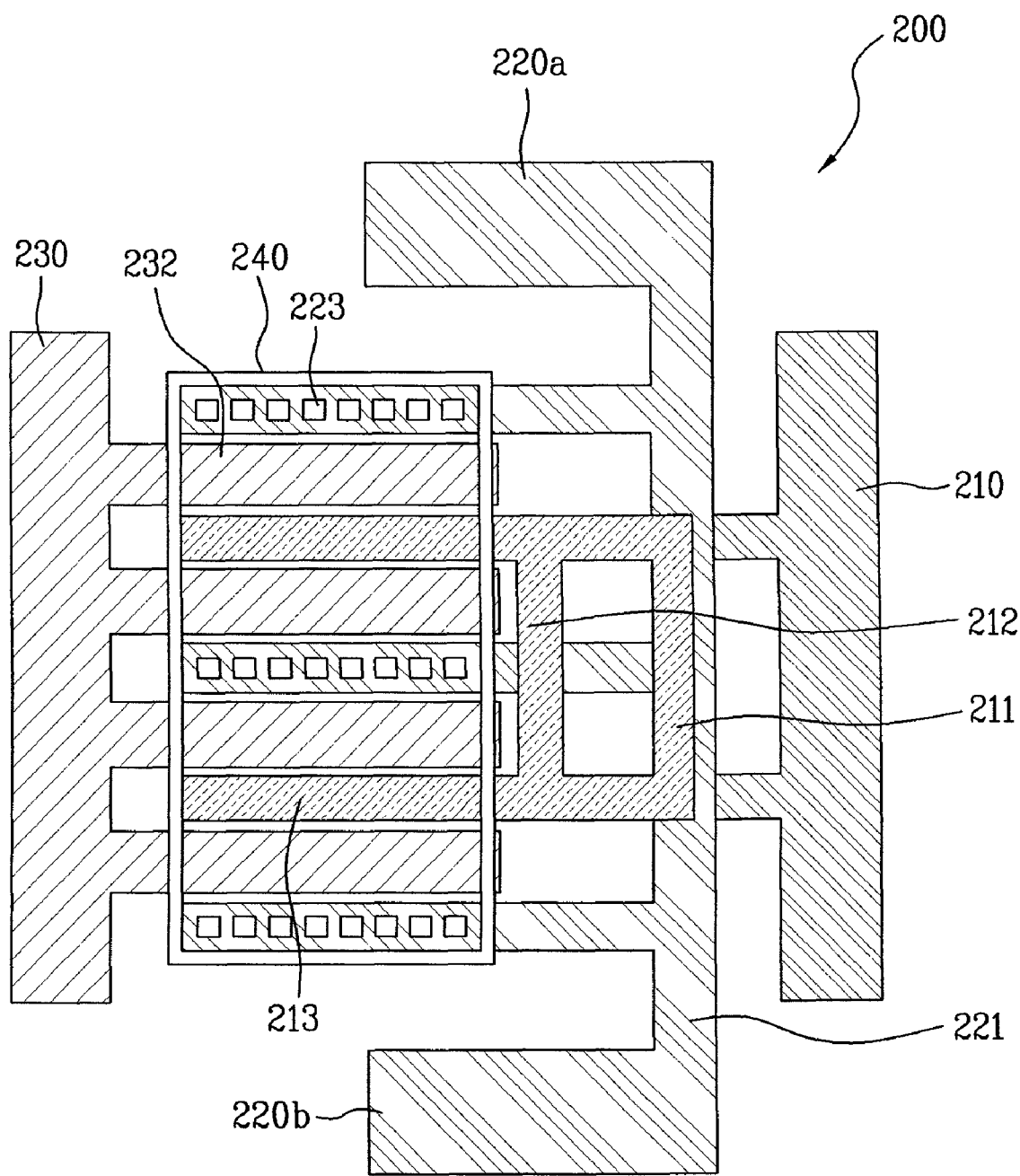

Example FIG. 4 is a plan view illustrating an electrode structure of a semiconductor device according to embodiments.

Figure 5:
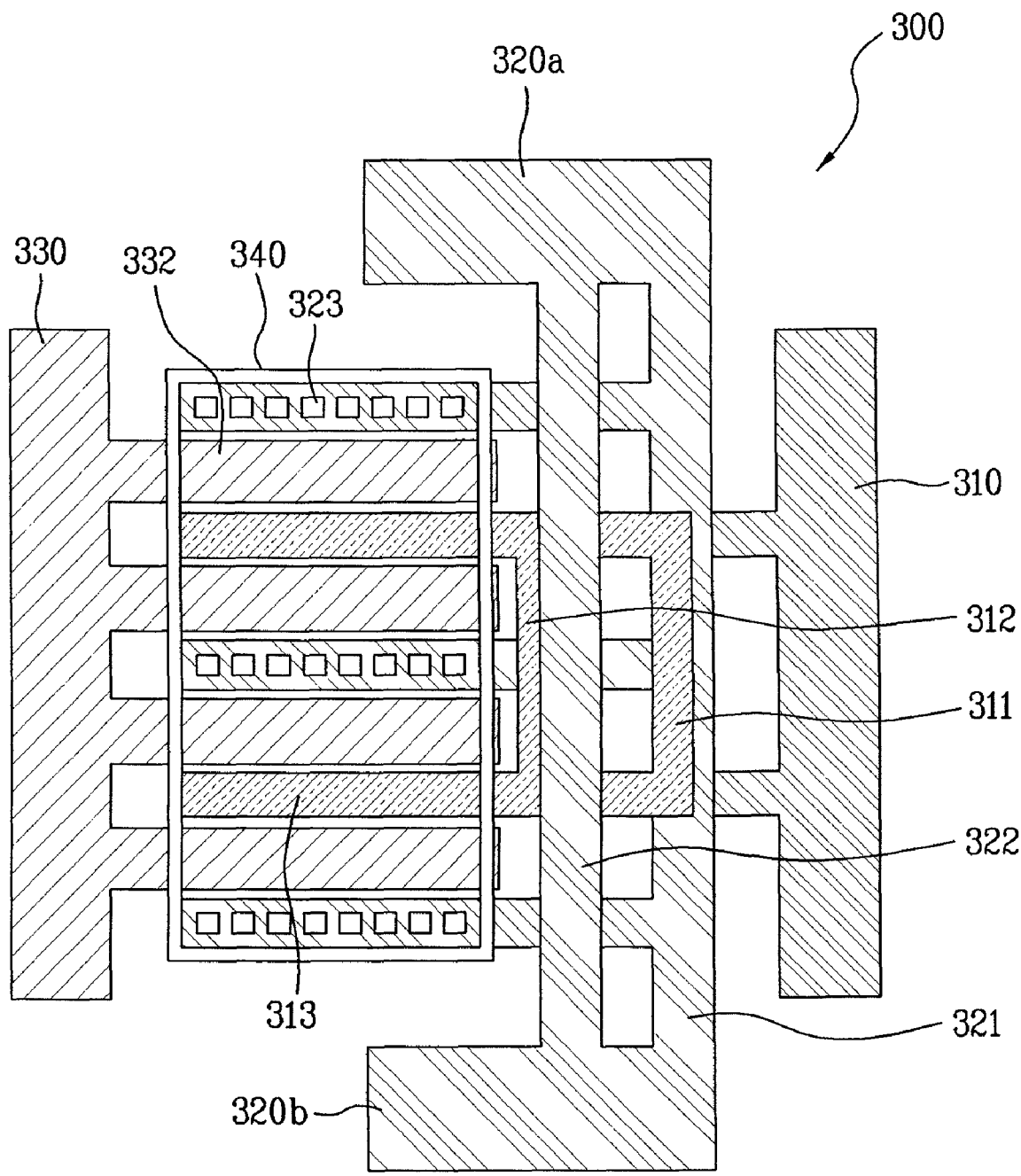

Example FIG. 5 is a plan view illustrating an electrode structure of a semiconductor device according to embodiments.

Figure 6:
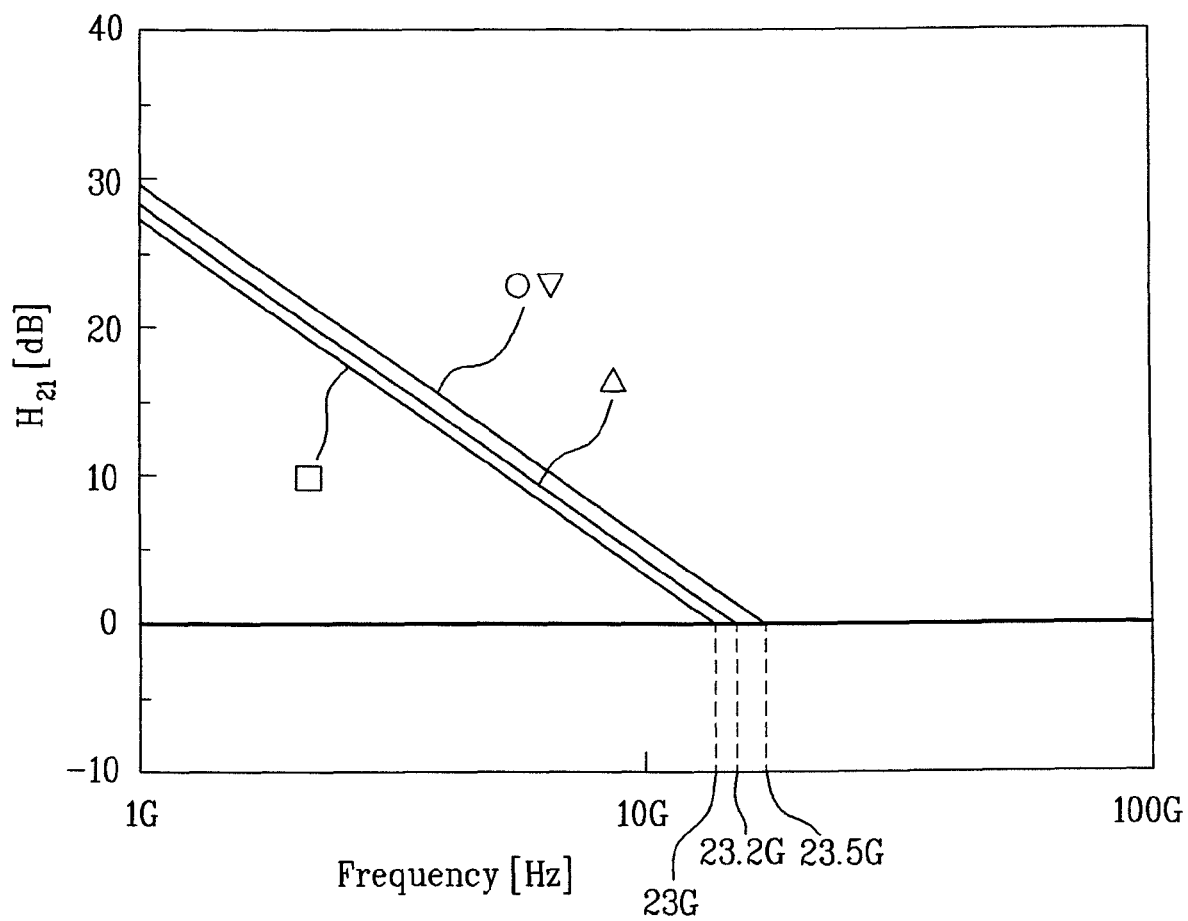

Example FIG. 6 is a graph illustrating $f_T$ characteristics of the semiconductor devices according to embodiments.

Figure 7:
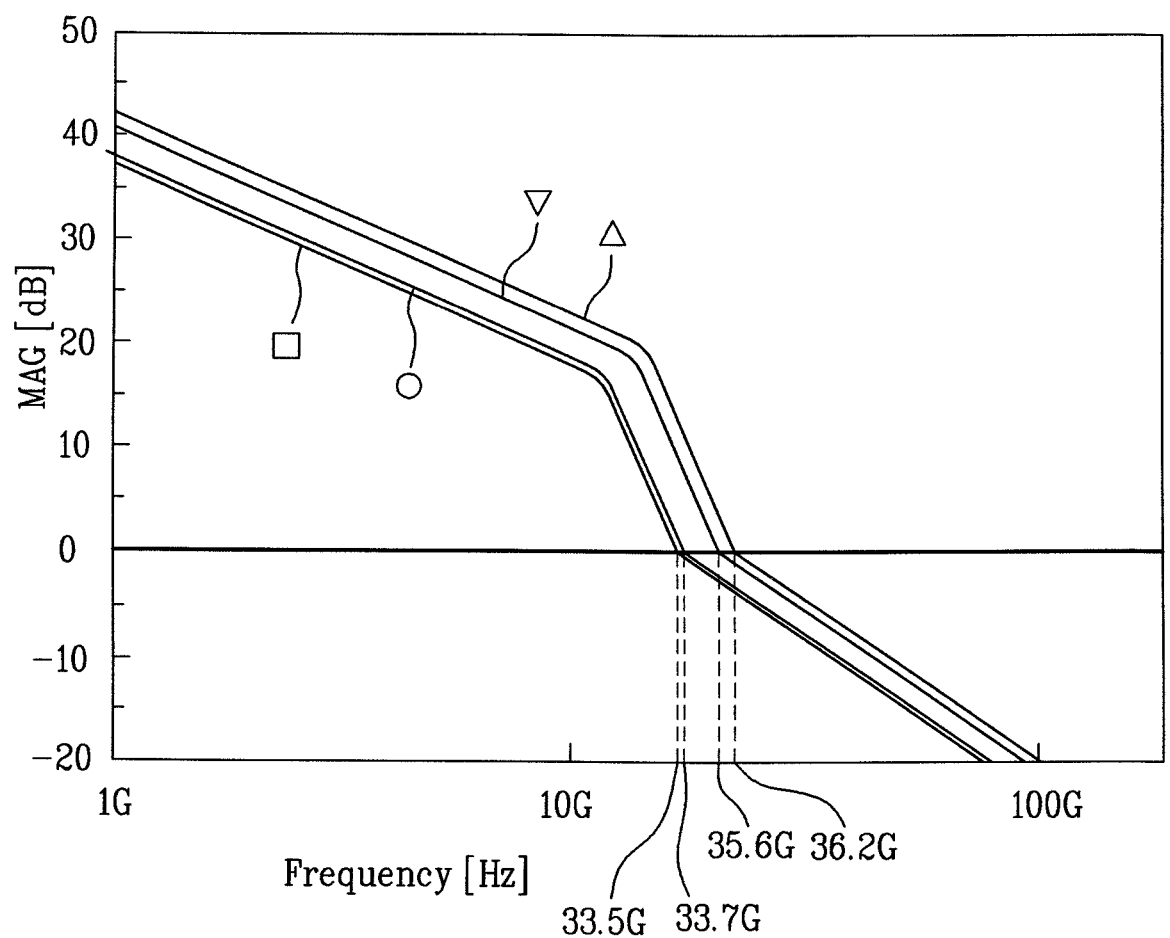

Example FIG. 7 is a graph illustrating $f_{MAX}$ characteristics of the semiconductor devices according to embodiments.

DESCRIPTION

Example FIG. 3 is a plan view illustrating an electrode structure of a semiconductor device 100 according to embodiments. Referring to example FIG. 3, the semiconductor device 100 includes an active region 140, a gate electrode 130, source electrodes 120a and 120b, a drain electrode 110, a plurality of gate fingers 132, a plurality of source fingers 123, and a plurality of drain fingers 112. There are two source electrodes 120a and 120b. For convenience of description, the upper source electrode is referred to as a first source electrode 120a, and the lower source electrode is referred to as a second source electrode 120b.

Figure 1:
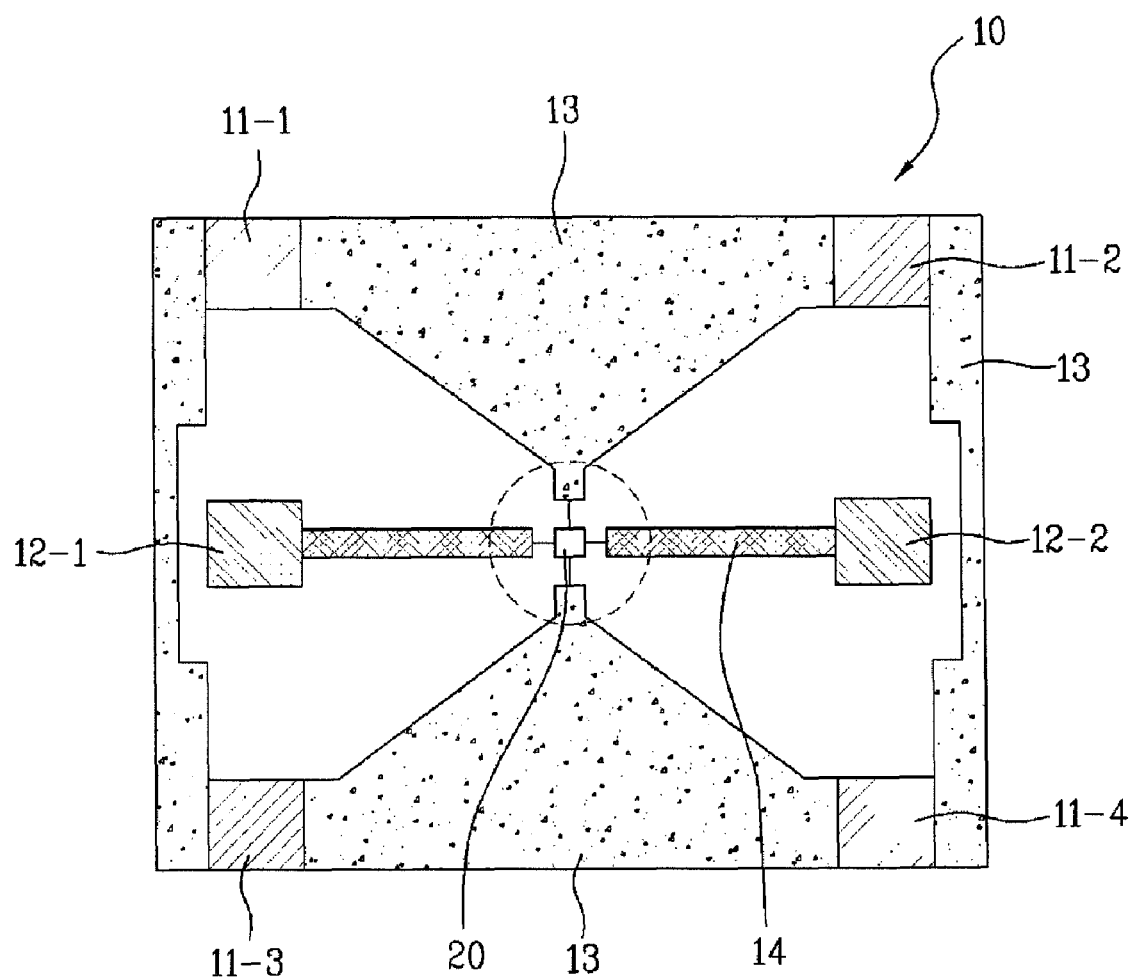
FIG. 1 is a view illustrating a semiconductor device mounted over a substrate of a GSG electrode structure.
Figure 2:
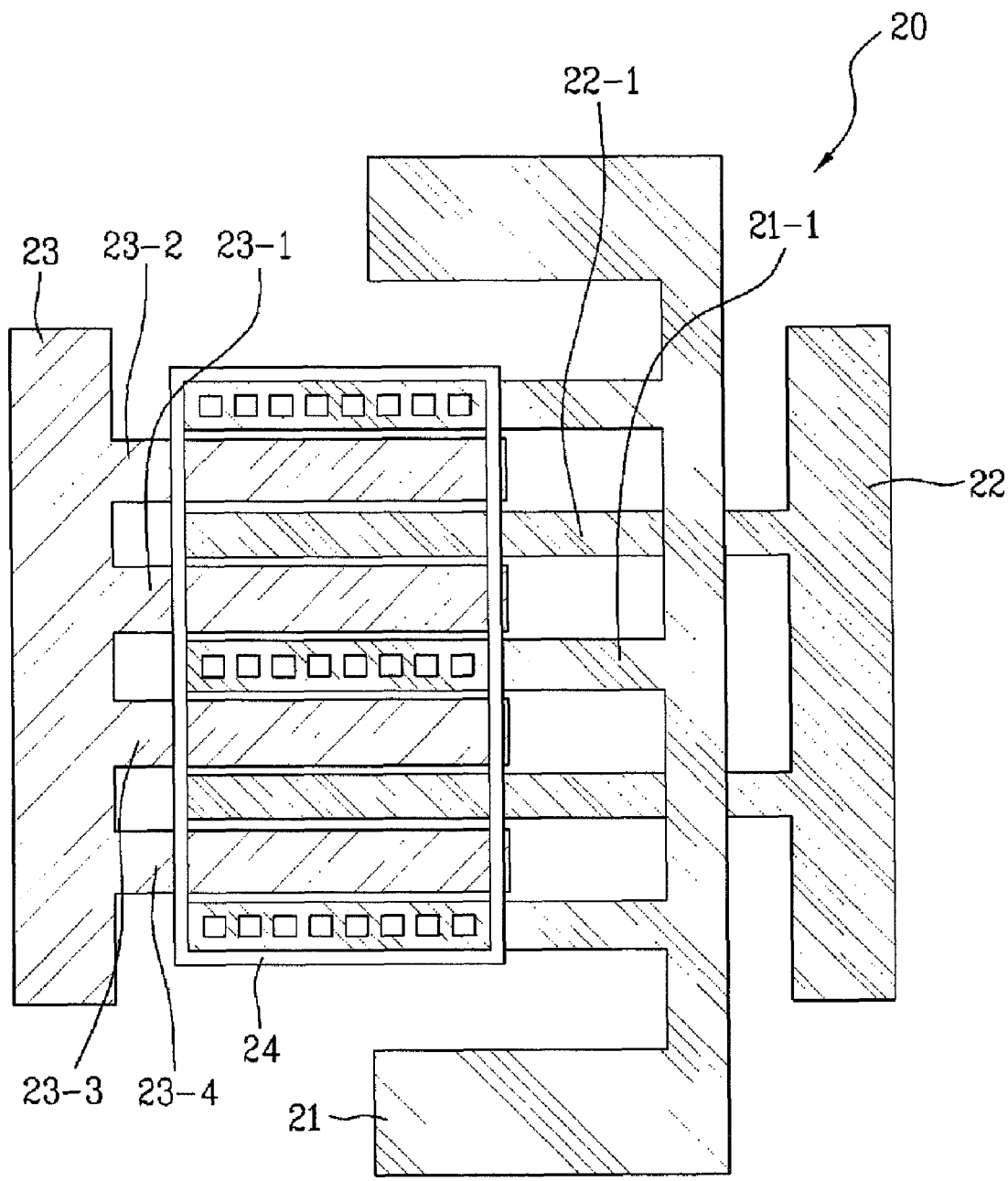
FIG. 2 is a plan view illustrating a finger type electrode structure of a semiconductor device.

The semiconductor device 100 may be mounted over the substrate 10 of the GSG electrode structure shown in FIG. 1. The repetitive description of a substrate having a GSG electrode structure and the mounting of the semiconductor device will be omitted. The active region 140 includes a source region, a drain region, and a channel region, which will be briefly described. The active region 140 of the substrate may be defined by an isolation layer, a well may be formed on the active region, and a gate dielectric may be formed at a portion of the substrate. The gate fingers 132 may be formed over the gate dielectric.

Subsequently, ions may be injected into the active region at opposite sides of the respective gate fingers 132 to form an LDD region. Sidewalls of a $SiO_2$ material may be formed on opposite sides of the respective gate fingers 132. Spacers of a SiN material may be formed at opposite sides of the respective sidewalls. The sidewalls may serve to eliminate interlayer stress between the spacers and the gate fingers 132 and to increase adhesion between the spacers and the gate fingers 132.

Subsequently, an ion injection process may be used to form a source region and a drain region in the active region on opposite sides of the spacers. Source fingers 123 and drain fingers 112 may be formed at the source region and the drain region, respectively. The source fingers 123 and the drain fingers 112 may alternately be formed between the gate fingers 132.

The gate electrode 130, the source electrodes 120a and 120b, and the drain electrode 110 may be formed around the active region 140. As shown in example FIG. 3, the active region 140 may be formed in the shape of a rectangle. The gate electrode 130 may be formed over one side of the active region (the left side of the active region 140 in example FIG. 3).

The drain electrode 110 may be formed over the side of the active region 140 opposite to the gate electrode 130 (the right side of the active region 140 in example FIG. 3). The first source electrode 120a and the second source electrode 120b may be formed over the remaining sides of the active region 140 such that the first source electrode 120a and the second source electrode 120b are opposite each other.

The plurality of gate fingers 132 diverge from the gate electrode 130 into the active region 140. The plurality of drain fingers 112 diverge from the drain electrode 110 into the active region 140. The drain fingers 112 may be disposed between the every two gate fingers 132.

Since the finger type semiconductor device may be constructed with the source fingers 123 and the drain fingers 112 symmetrically located about the gate fingers 132, it is possible to selectively use the electrodes by controlling signals applied to the source fingers 123 and the drain fingers 112. That is, as circumstances may require, the source electrodes may be used as the drain electrode, and the drain electrode may be used as the source electrodes.

The first source electrode 120a and the second source electrode 120b may be connected to each other by a source electrode connection line 121. The source electrode connection line 121 vertically connects the first source electrode 120a and the second source electrode 120b outside the active region 140.

The plurality of source fingers 123 diverge from the source electrode connection line 121 into the active region 140. The source fingers 123 may be formed over the region between the gate fingers 132 where the drain fingers 112 are not formed. The gate fingers 132, the drain fingers 112, and the source fingers 123 may be made of a metal line, e.g., a copper line or an aluminum line. Also, the gate fingers 132, the drain fingers 112, and the source fingers 123 may be formed over different semiconductor layers.

The gate fingers 132 and the drain fingers 112 may be formed over the same semiconductor layer, since there is no overlapping region between the gate fingers 132 and the drain fingers 112. On the other hand, the source fingers 123 and the drain fingers 112 may be formed on different semiconductor layers, since the source fingers 123 and the drain fingers 112 may overlap with each other at the right side of the active region 140.

The first source electrode 120a and the second source electrode 120b may be connected to each other via a grid line 122 similar to the source electrode connection line 121. The grid line 122 vertically connects the first source electrode 120a and the second source electrode 120b outside the active region 140. The grid line 122 may be formed on a different layer such that the grid line is not electrically connected to the source fingers 123, the source electrode connection line 121, and the drain fingers 112.

The grid line 122 may be illustrated to electrically connect the source electrodes 120a and 120b; however, the grid line 122 may connect the source electrodes 120a and 120b and the source fingers 123 or may achieve the connection between the respective source fingers 123. Also, two or more grid lines 122 may be formed. In this case, the grid lines 122 may be parallel to each other.

When connecting the respective parts of the source electrodes via the grid line 122 as described above, analogue characteristics of a signal are improved, which can be confirmed through the improvement of RF characteristics. The description in relation to the RF characteristics will be given with reference to example FIGS. 6 and 7.

Example FIG. 4 is a plan view illustrating an electrode structure of a semiconductor device 200 according to embodiments. Referring to example FIG. 4, the semiconductor device 200 includes a gate electrode 230, gate fingers 232, source electrodes 220a and 220b, a source electrode connection line 221, source fingers 223, a drain electrode 210, drain fingers 213, and an active region 240. The semiconductor device 200 is different from the semiconductor device 100 of example FIG. 3 in that grid lines 211 and 212 are formed not at the source electrodes 120a and 120b (see example FIG. 3) but at the drain fingers 213. The disposition and connection of the remaining components are the same as those described with reference to example FIG. 3, and therefore, the repetitive description thereof will be omitted.

The at least two drain fingers 213 may be connected to each other via the grid lines 211 and 212. A plurality of the grid lines 211 and 212 may be formed. The grid lines 211 and 212 of the drain fingers 213 may be formed on a different semiconductor layer than the layer where source electrodes 220a and 220b, the source electrode connection line 221, and the source fingers 223 are formed. The grid lines 211 and 212 of the drain fingers 213 may be electrically separated from the source electrodes 220a and 220b, the source electrode connection line 221, and the source fingers 223.

Also, the plurality of grid lines 211 and 212 may be formed on different layers. In this case, the grid lines 211 and 212 may be electrically connected to the drain fingers 213 through via holes. It is possible to improve RF characteristics as described with reference to example FIG. 3 by using the grid structure of the drain fingers 213 as described above.

Example FIG. 5 is a plan view illustrating an electrode structure of a semiconductor device 300 according to embodiments. Referring to example FIG. 5, the semiconductor device 300 includes a gate electrode 330, gate fingers 332, source electrodes 320a and 320b, a source electrode connection line 321, source fingers 323, a drain electrode 310, drain fingers 313, and an active region 340. The semiconductor device 300 is constructed in a combination of the electrode structure of example FIG. 3 and the electrode structure of example FIG. 4. Consequently, the semiconductor device 300 may be distinguished from the electrode structure of example FIG. 3 and the electrode structure of example FIG. 4 in that grid lines are formed at the drain fingers 313 as well as the source electrodes 320a and 320b. The disposition and connection of the remaining components are the same as those previously described, and therefore, only the distinguishing features will be hereinafter described.

The grid line 322 connects the first source electrode 320a and the second source electrode 320b outside the active region 340. The grid line 322 for the source electrodes may be parallel to the source electrode connection line 321. The grid line 322 for the source electrodes may connect the source electrodes 320a and 320b and the source fingers 323 or may achieve the connection between the respective source fingers 323. Also, the grid lines 311 and 312 for the drain electrode 310 connect the respective drain fingers 313 outside the active region 340.

The grid line 322 for the source electrodes, the grid lines 311 and 312 for the drain electrode 310, and the source electrode connection line 321 may be alternately stacked over different layers. When the grid lines 322, 311, and 312 are formed over different layers, the grid lines 322, 311, and 312 may be electrically connected to corresponding parts through via holes. Also, the number and the connection structure of the grid lines 322, 311, and 312 may be implemented in various forms as previously described with reference to example FIGS. 3 and 4.

Example FIG. 6 is a graph illustrating $f_T$ characteristics of the semiconductor devices according to embodiments. Example FIG. 7 is a graph illustrating $f_{MAX}$ characteristics of the semiconductor devices according to embodiments. In example FIGS. 6 and 7, symbol "□" indicates the measurement of a semiconductor device with no grid structure, symbol "Δ" indicates the measurement of the semiconductor device shown in example FIG. 3. Also, symbol "○" indicates the measurement of the semiconductor device shown in example FIG. 4, and symbol "▼" indicates the measurement of the semiconductor device shown in example FIG. 5.

Also, in example FIGS. 6 and 7, the x axis indicates a frequency band, and the y axis indicates an electric power value. In example FIG. 6, when the value of "$f_T$" was "1," the electric power value was "0." Consequently, when the value of the y axis was "0," the operational frequencies of the semiconductor devices were measured as follows.

First, for the no grid structure, the operational frequency of the semiconductor device was measured to be approximately 23 GHz. Second, for embodiments relating to FIG. 3, the operational frequency of the semiconductor device was measured to be approximately 23.2 GHz. Third, for embodiments relating to FIGS. 4 and 5, the operation frequencies of the semiconductor devices were measured to be approximately 23.5 GHz. Consequently, it can be seen that the frequency operation characteristics were improved with respect to electric current.

In example FIG. 7, when the value of "$f_{MAX}$" was "1," the electric power value was "0." Consequently, when the value of the y axis was "0," the operational frequencies of the semiconductor devices were measured as follows.

First, for the no grid structure, the operational frequency of the semiconductor device was measured to be approximately 33.5 GHz. Second, for embodiments relating to FIG. 3, the operational frequency of the semiconductor device was measured to be approximately 36.2 GHz. Third, for embodiments relating to FIG. 4, the operational frequency of the semiconductor device was measured to be approximately 33.7 GHz. Fourth, for embodiments relating to FIG. 5, the operational frequency of the semiconductor device was measured to be approximately 35.6 GHz.

The measurement revealed that, for embodiments relating to FIG. 3, the operational characteristics of the semiconductor device was improved by approximately 8%, and, for embodiments relating to FIG. 3, the operational characteristics of the semiconductor device were improved by approximately 6%.

As apparent from the above description, the semiconductor device according to embodiments is characterized in that the source electrodes and the drain electrode may be connected to each other in a grid structure, or the fingers of the source electrodes and the fingers of the drain electrode may be connected to each other in a grid structure. Consequently, embodiments have the effect of improving the RF characteristics.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
   an active region including a source region, a drain region, and a channel region;
   a gate electrode, source electrodes, and a drain electrode formed around the active region;
   a plurality of gate fingers diverging from the gate electrode into the channel region;
   a plurality of source fingers diverging from the source electrodes into the source region, the source fingers being disposed between the gate fingers in a predetermined pattern, the source fingers having at least two finger lines connected to each other via at least one grid line; and
   a plurality of drain fingers diverging from the drain electrode into the drain region, the drain fingers being disposed between the gate fingers where the source fingers are not disposed,
   wherein the at least one grid line vertically connects a first source electrode and a second source electrode outside the active region, and the at least one grid line is formed over a layer different from layers where the source fingers and the drain fingers are formed.

2. The apparatus of claim 1, wherein
   the active region is formed in the shape of a rectangle,
   the gate electrode is located over one side of the active region,
   the drain electrode is located over the other side of the active region opposite the gate electrode, and
   there are two source electrodes, the two source electrodes being located at the remaining sides of the active region such that the source electrodes are opposite to each other.

3. The apparatus of claim 1, wherein the at least one grid line for the source fingers includes a plurality of grid lines arranged parallel to each other.

4. The apparatus of claim 1, wherein the gate fingers, the drain fingers, and the source fingers are made of metal, and the gate fingers, the drain fingers, and the source fingers are formed over different semiconductor layers.

5. The apparatus of claim 1, wherein the gate fingers, the drain fingers, and the source fingers are made of at least one of copper or aluminum line.

6. The apparatus of claim 1, wherein the drain fingers have at least two finger lines connected to each other via at least one grid line.

7. The apparatus of claim 6, wherein the at least one grid line for the drain fingers includes a plurality of grid lines arranged parallel to each other.

8. The apparatus of claim 1, wherein the gate fingers and the drain fingers are formed over the same semiconductor layer.

9. The apparatus of claim 8, wherein the source fingers and the drain fingers are formed over different semiconductor layers.

10. An apparatus comprising:
    an active region including a source region, a drain region, and a channel region;
    a gate electrode, source electrodes, and a drain electrode formed around the active region;
    a plurality of gate fingers diverging from the gate electrode into the channel region;
    a plurality of source fingers diverging from the source electrodes into the source region, the source fingers being disposed between the gate fingers in a predetermined pattern; and
    a plurality of drain fingers diverging from the drain electrode into the drain region, the drain fingers being disposed between the gate fingers where the source fingers are not disposed, the drain fingers having at least two finger lines connected to each other via at least one grid lines,
    wherein the at least one grid line for the source fingers includes a plurality of grid lines, and the at least one grid line for the drain fingers includes a plurality of grid lines, the grid lines for the source fingers and the grid lines for the drain fingers being alternately stacked over different layers.

11. The apparatus of claim 10, wherein the source fingers have at least two finger lines connected to each other via at least one grid line.

12. The apparatus of claim 10, wherein the at least one grid line for the drain fingers includes a plurality of grid lines arranged parallel to each other.

13. The apparatus of claim 10, wherein the at least one grid line includes a plurality of grid lines formed over different layers.

14. The apparatus of claim 10, wherein the gate fingers, the drain fingers, and the source fingers are made of metal, and the gate fingers, the drain fingers, and the source fingers are formed over different layers.

15. The apparatus of claim 10, wherein
    the active region is formed in the shape of a rectangle,
    the gate electrode is located over one side of the active region,
    the drain electrode is located over the other side of the active region opposite the gate electrode, and
    two source electrodes are located over the remaining sides of the active region opposite to each other.

16. The apparatus of claim 15, further comprising:
    a source electrode connection line for connecting the two source electrodes to each other outside the active region, the source fingers diverging from the source electrode connection line.

17. The apparatus of claim 15, comprising:
    a grid line for connecting the two source electrodes to each other outside the active region.

18. The apparatus of claim 15, wherein the at least one grid line for the source fingers includes a plurality of grid lines arranged parallel to each other.

* * * * *